(12) United States Patent
Zhai

(10) Patent No.: US 10,684,716 B2
(45) Date of Patent: Jun. 16, 2020

(54) STRETCHABLE PANEL AND FLEXIBLE DISPLAY DEVICE

(71) Applicant: SHANGHAI TIANMA MICRO-ELECTRONICS CO., LTD., Shanghai (CN)

(72) Inventor: Yingteng Zhai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/215,571

(22) Filed: Dec. 10, 2018

(65) Prior Publication Data

US 2019/0107911 A1 Apr. 11, 2019

(30) Foreign Application Priority Data

Aug. 28, 2018 (CN) .......................... 2018 1 0985579

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G06F 3/0446* (2019.05); *G06F 3/0448* (2019.05); *H01L 27/323* (2013.01); *H01L 27/3244* (2013.01); *H01L 51/0097* (2013.01); *H01L 51/5209* (2013.01);
(Continued)

(58) Field of Classification Search
CPC . G06F 2203/04102; G06F 2203/04111; G06F 3/0412; G06F 3/044; G06F 3/0446; G06F 3/0448; H01L 2251/5338; H01L 27/323; H01L 27/3244; H01L 51/0097; H01L 51/5209
See application file for complete search history.

(56) References Cited

U.S. PATENT DOCUMENTS

| | | | |
|---|---|---|---|
| 2010/0141605 A1* | 6/2010 | Kang | .................... G06F 1/1626 345/174 |
| 2014/0204285 A1* | 7/2014 | Jang | ........................ G06F 3/044 349/12 |

(Continued)

*Primary Examiner* — Hong Zhou
(74) *Attorney, Agent, or Firm* — Kilpatrick Townsend & Stockton, LLP

(57) ABSTRACT

A stretchable panel and a flexible display device are provided. The stretchable panel includes a stretchable substrate and an electrode layer. The stretchable substrate includes multiple island-like structures arranged in an array, and any two adjacent island-like structures are separated from each other and connected via a bridge. The electrode layer includes one or more first sub-electrodes and one or more second sub-electrodes located on the multiple island-like structures. The first sub-electrode is insulated from the second sub-electrode. First sub-electrodes in at least one column of island-like structures are electrically connected sequentially to form a first electrode, and second sub-electrodes on at least one row of island-like structures are electrically connected sequentially to form a second electrode. A touch position and/or a stretched state can be determined based on the change in capacitance between the first electrode and the second electrode.

16 Claims, 10 Drawing Sheets

(51) Int. Cl.
*H01L 27/32* (2006.01)
*H01L 51/00* (2006.01)
*H01L 51/52* (2006.01)

(52) U.S. Cl.
CPC .............. *G06F 2203/04102* (2013.01); *G06F 2203/04111* (2013.01); *H01L 2251/5338* (2013.01)

(56) References Cited

U.S. PATENT DOCUMENTS

| | | | |
|---|---|---|---|
| 2016/0049602 A1* | 2/2016 | Kim | H01L 51/0097 257/40 |
| 2016/0179259 A1* | 6/2016 | Watanabe | G06F 3/044 345/174 |
| 2016/0202831 A1* | 7/2016 | Kim | G06F 3/044 345/173 |
| 2016/0268352 A1* | 9/2016 | Hong | H01L 27/3218 |
| 2016/0291725 A1* | 10/2016 | Zhai | G06F 3/0412 |
| 2017/0005077 A1* | 1/2017 | Kim | G06F 1/1643 |
| 2017/0249886 A1* | 8/2017 | Choi | H05K 1/0283 |
| 2017/0364187 A1* | 12/2017 | Zhai | G02F 1/133305 |
| 2018/0246599 A1* | 8/2018 | Choi | G01B 7/34 |

* cited by examiner

STRETCHABLE PANEL AND FLEXIBLE DISPLAY DEVICE

The present application claims priority to Chinese Patent Application No. 201810985579.X, titled "STRETCHABLE PANEL AND FLEXIBLE DISPLAY DEVICE", filed on Aug. 28, 2018 with the Chinese Patent Office, which is incorporated herein by reference in its entirety.

FIELD

The present disclosure relates to the field of flexible display technology, and particularly to a stretchable panel and a flexible display device.

BACKGROUND

With the development of display technology, lives of human beings are gradually changed due to portable devices. Flexible display panels attract more and more attentions of users of portable devices owing to their advantages such as foldable, portable and a wide application range. That is, a stretchable flexible display panel according to a conventional technology brings a brand new viewing experience to users. However, the conventional technology only discloses that how the stretchable flexible display panel displays, while the principle of touch on the stretchable flexible display panel is not disclosed, thus the application of the stretchable flexible display panel is limited.

SUMMARY

In view of the above, a stretchable panel and a flexible display device are provided according to the present disclosure, to provide a stretchable flexible display panel having a touch function.

A stretchable panel is provided, which includes a stretchable substrate and an electrode layer.

The stretchable substrate includes multiple island-like structures arranged in an array in a row direction and a column direction, and any two adjacent island-like structures are separated from each other and are connected with each other via a bridge.

The electrode layer includes one or more first sub-electrodes and one or more second sub-electrodes. The first sub-electrode is insulated from the second sub-electrode, and the first sub-electrodes and the second sub-electrodes are all located on the plurality of island-like structures. First sub-electrodes located on at least one column of island-like structures are electrically connected sequentially to form a first electrode, and second sub-electrodes located on at least one row of island-like structures are electrically connected sequentially to form a second electrode.

A flexible display device is further provided, which includes the stretchable panel described above.

Compared with the conventional technology, the following advantages can be achieved with embodiments of the present disclosure. In the stretchable panel and the flexible display device according to the present disclosure, the stretchable substrate includes multiple island-like structures arranged in an array in a row direction and a column direction, and any two adjacent island-like structures are separated from each other and connected with each other via a bridge. The electrode layer includes one or more first sub-electrodes and one or more second sub-electrodes. The first sub-electrode is insulated from the second sub-electrode, and the first sub-electrodes and the second sub-electrodes are all located on the plurality of island-like structures. First sub-electrodes located on at least one column of island-like structures are electrically connected sequentially to form a first electrode, and second sub-electrodes located on at least one row of island-like structures are electrically connected sequentially to form a second electrode. In view of this, a touch position and/or a stretched state may be determined based on the change in capacitance between the first electrode and the second electrode. That is, with the stretchable panel according to the present disclosure, not only a touch function of the stretchable flexible display panel is realized, but also the function of detecting the stretched state is realized, thereby expanding the application of the stretchable panel and the flexible display device.

BRIEF DESCRIPTION OF THE DRAWINGS

The drawings to be used in the description of the embodiments or the conventional technology are described briefly as follows. It is apparent that the drawings in the following description only illustrate some embodiments of the present disclosure.

DETAILED DESCRIPTION

The above is the core idea of the present disclosure. Embodiments of the present disclosure are described clearly and completely in conjunction with the accompanying drawings in the embodiments of the present disclosure hereinafter. It is apparent that the described embodiments are merely some rather than all of embodiments of the present disclosure.

Figure 1:
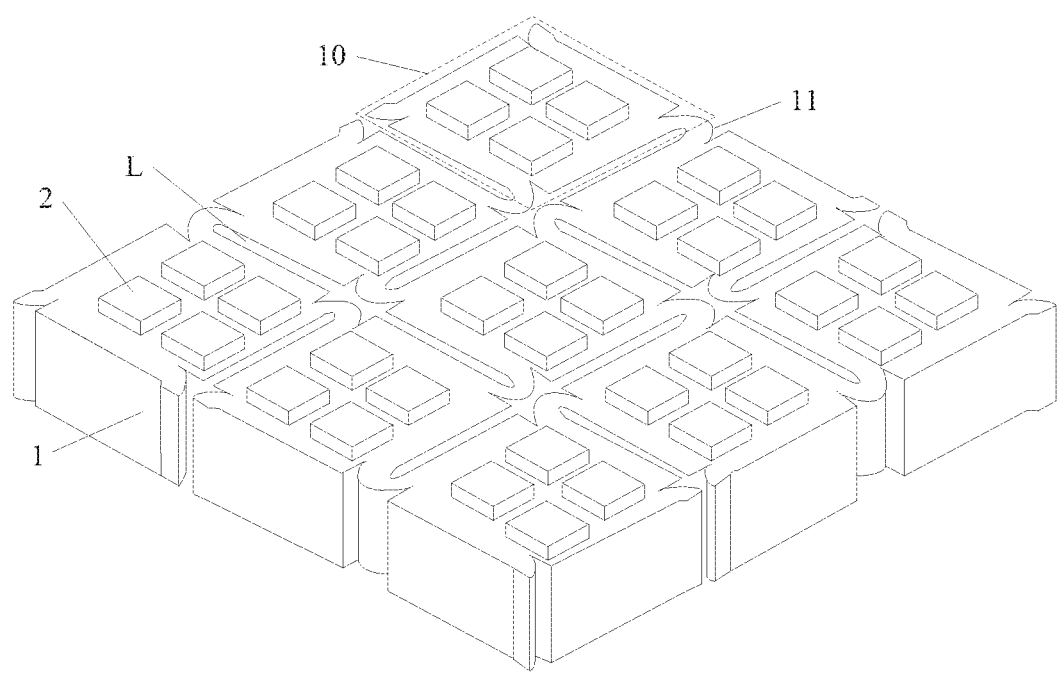
FIG. 1 is a schematic diagram of a structure of a stretchable panel according to an embodiment of the present disclosure.

A stretchable panel is provided according to an embodiment of the present disclosure. As shown in FIG. 1, FIG. 1 is a schematic diagram of a structure of a stretchable panel according to an embodiment of the present disclosure. The stretchable panel includes a stretchable substrate 1 and an electrode layer 2 located on the stretchable substrate 1.

Figure 2:
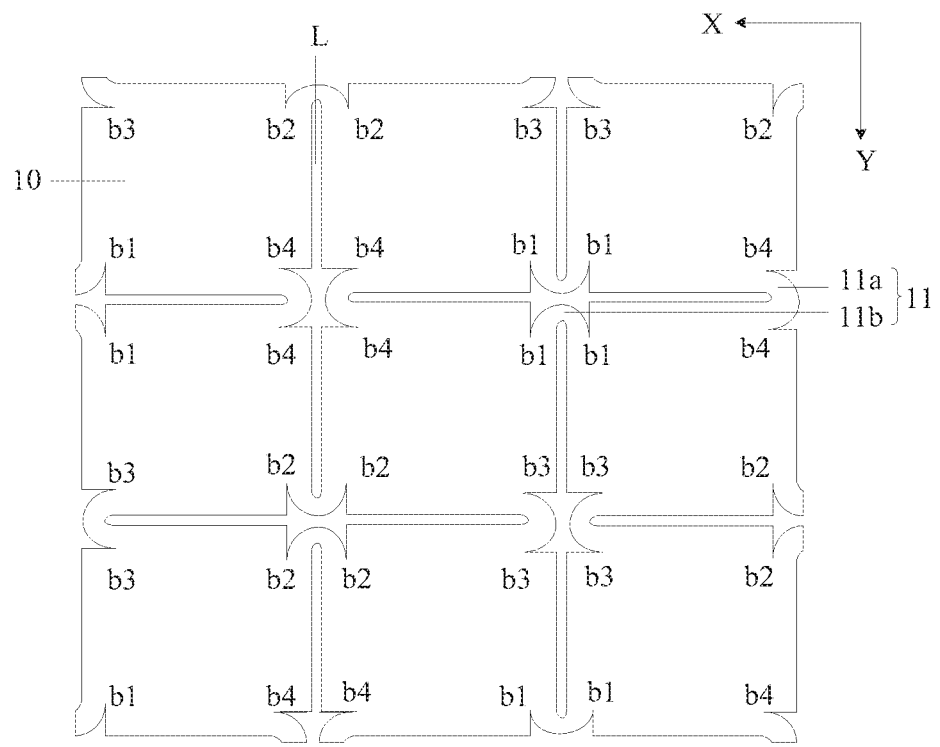
FIG. 2 is a schematic top view of a structure of a stretchable substrate according to an embodiment of the present disclosure in a un-stretched state.
Figure 3:
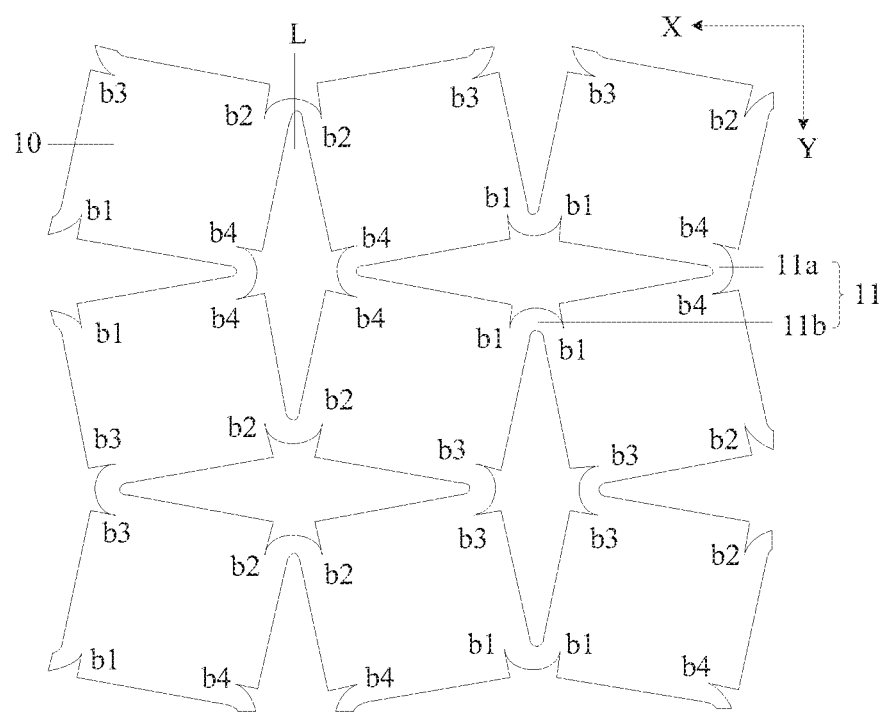
FIG. 3 is a schematic top view of a structure of a stretchable substrate according to an embodiment of the present disclosure in a stretched state.

As shown in FIG. 1 to FIG. 3, FIG. 2 is a schematic top view of a structure of a stretchable substrate according to an embodiment of the present disclosure in an un-stretched state, and FIG. 3 is a schematic top view of a structure of stretchable substrate according to an embodiment of the present disclosure in a stretched state. The stretchable substrate 1 includes multiple island-like structures 10 arranged in an array in a row direction X and a column direction Y.

The island-like structures 10 are formed by dividing the stretchable substrate 1, and each of the island-like structures 10 indicates one thus formed block substrate. Any two adjacent island-like structures 10 are separated from each other and connected with each other via a bridge 11. In addition, any two adjacent island-like structures 10 may be shifted relative to each other. In one embodiment, two adjacent island-like structures 10 are separated from each other by a gap or a slit L, and the two adjacent island-like structures 10 are connected with each other via the bridge 11. It is to be understood that the island-like structure 10 herein constitutes a part of the stretchable substrate 1. The island-like structure 10 exists really, rather than just indicating an island-like pattern.

It is to be noted that, in this embodiment, the stretchable substrate 1 may be formed by cutting a flexible substrate and have island-like structures 10 independent from each other and connected with each other via bridges. However, the present disclosure is not limited thereto. In other embodiments, the stretchable substrate 1 may also be formed in other manners such as a mask evaporation manner. The stretchable substrate 1 may be made of polyimide (PI), polycarbonate (PC), polyethylene terephthalate (PET) or the like.

In a case where the stretchable substrate 1 is stretched, the bridge 11 is stretched to cause the island-like structure 10 to move, such that the gap or slit L between the island-like structures 10 is widened. However, the size and shape of each island-like structure 10 remain unchanged, thereby avoiding the pixel structure and the electrode structure on the island-like structure 10 from being damaged.

As shown in FIG. 2 and FIG. 3, the bridge 11 includes a first bridge 11a and a second bridge 11b, and two island-like structures 10 adjacent to each other in the column direction Y are connected with each other via the first bridge 11a, and two island-like structures 10 adjacent to each other in the row direction X are connected with each other via the second bridge 11b.

Further, the island-like structure 10 has a rectangular shape or an approximately rectangular shape, but the present disclosure is not limited thereto. In other embodiments, the island-like structure 10 may also has a triangle shape, an approximately triangle shape, a diamond shape, an approximately diamond shape, a pentagon shape, a hexagons shape and the like.

In the present disclosure, as shown in FIGS. 2 and 3, the island-like structure 10 includes a first pair of angles facing to each other and a second pair of angles facing to each other. The first pair of angles includes a first angle b1 and a second angle b2, and the second set of angles includes a third angle b3 and a fourth angle b4. Further, in the column direction Y and the row direction X, angles of a same type of two adjacent island-like structures 10 are arranged adjacent to each other. In one embodiment, the first angle b1 of an island-like structure 10 is arranged adjacent to the first angle b1 of an adjacent island-like structure 10. The second angle b2 of an island-like structure 10 is arranged adjacent to the second angle b2 of an adjacent island-like structure 10. Similarly, the third angles b3 and the fourth angles b4 are arranged in the same manner.

Further, in the column direction Y, angles of a same type of the adjacent island-like structures 10 are connected with each other via the first bridge 11a, and in the row direction X, angles of a same type of the adjacent island-like structures 10 are connected with each other via the second bridge 11b. In one embodiment, in the column direction Y, the adjacent third angles b3 are connected with each other via the first bridge 11a, and the adjacent fourth angles b4 are connected with each other via the first bridge 11a, and in the row direction X, the adjacent first angles b1 are connected with each other via the second bridge 11b, and the adjacent second angles b2 are connected with each other via the second bridge 11b.

Figure 4:
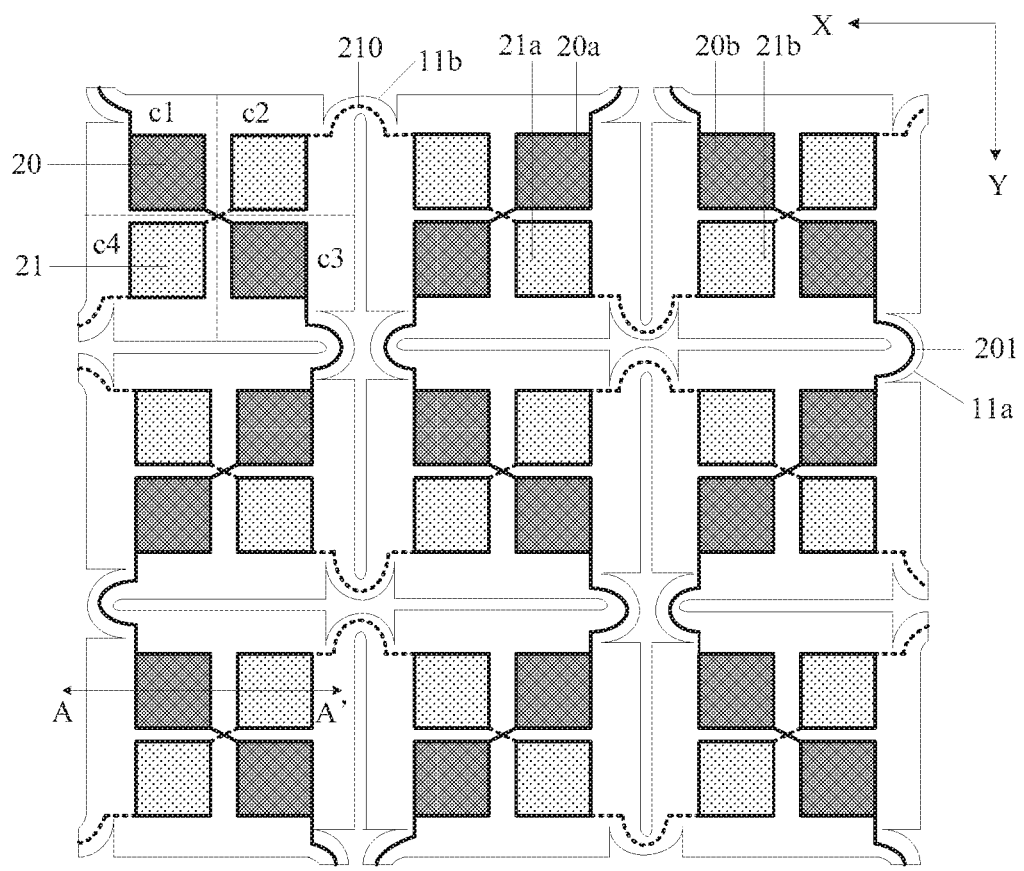
FIG. 4 is a schematic top view of a structure of a stretchable panel according to an embodiment of the present disclosure.

As shown in FIG. 4, FIG. 4 is a schematic top view of a structure of the stretchable panel according to an embodiment of the present disclosure. The electrode layer 2 includes at least one first sub-electrode 20 and at least one second sub-electrode 21. The first sub-electrode 20 is insulated from the second sub-electrode 21, and all the at least one first sub-electrode 20 and the at least one second sub-electrode 21 are located on the island-like structures 10.

It is to be noted that the first sub-electrode 20 and the second sub-electrode 21 may be located on different layers, and are insulated from each other by an insulating layer. In one embodiment, the first sub-electrode 20 and the second sub-electrode 21 may be located on the same layer, and an insulating layer is interposed between an overlapped portion (such as overlapped connection lines) of the first sub-electrode 20 and the second sub-electrode 21 to insulate the first sub-electrode 20 from the second sub-electrode 21. In addition, the first sub-electrode 20 and the second sub-electrode 21 may be made of Indium tin oxide (ITO). However, the present disclosure is not limited thereto. In other embodiments, other conductive materials may also be used, for example a metal grid.

In the present disclosure, the first sub-electrode 20 and the second sub-electrode 21 may be arranged on one island-like structure 10, or the first sub-electrode 20 is arranged on one island-like structure 10, and the second sub-electrode 21 is arranged on another island-like structure 10. However, regardless of whether the first sub-electrode 20 and the second sub-electrode 21 are both arranged on one island-like structure 10, first sub-electrodes 20 on at least one column of island-like structures 10 are electrically connected sequentially to form a first electrode, and second sub-electrodes 21 on at least one row of island-like structures 10 are electrically connected sequentially to form a second electrode.

In order to ensure accuracy of the touch detection and the stretch detection, as shown in FIG. 4, first sub-electrodes 20 on a column of island-like structures 10 are electrically connected sequentially to form a first electrode, and second sub-electrodes 21 on a row of island-like structures 10 are electrically connected sequentially to form a second electrode.

Figure 5:
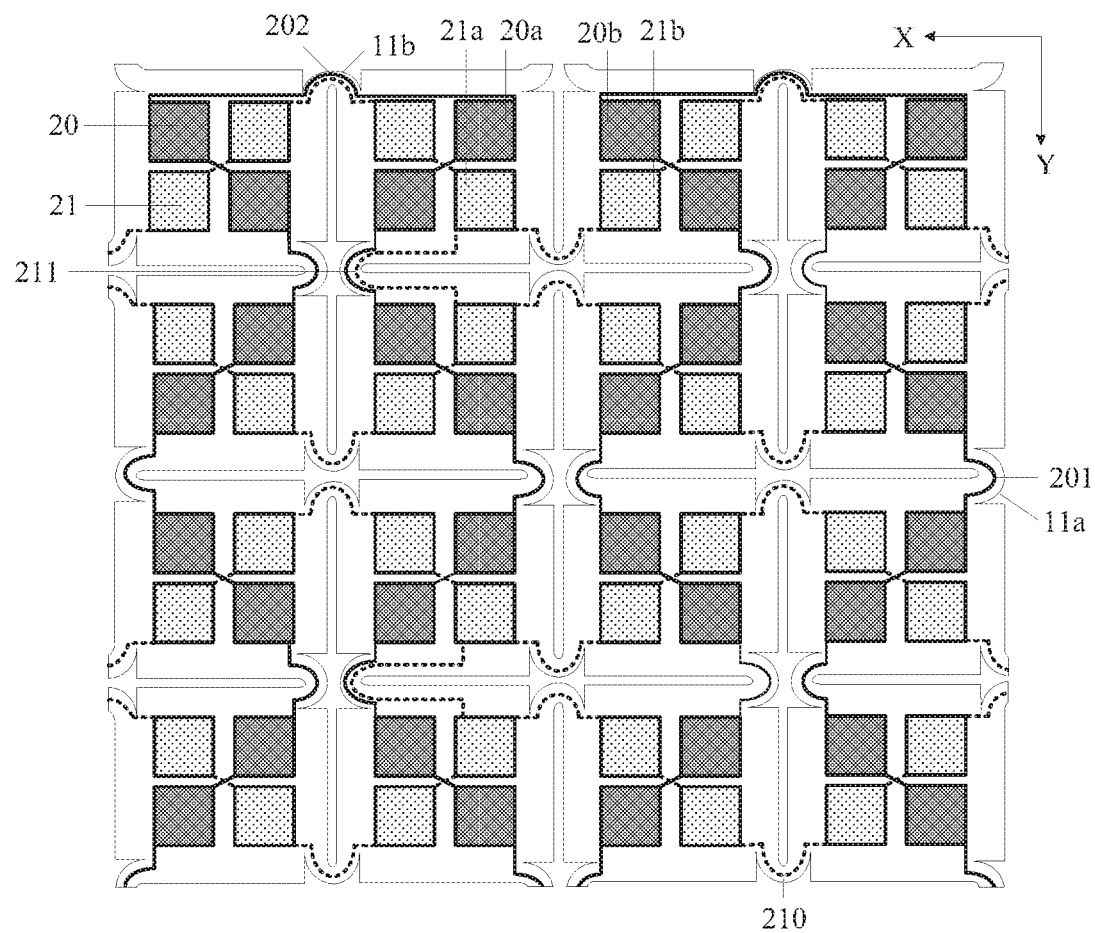
FIG. 5 is a schematic top view of a structure of a stretchable panel according to another embodiment of the present disclosure.

Further, in order to increase a background capacitance between the first electrode and the second electrode and reduce the number of paths, as shown in FIG. 5, FIG. 5 is a schematic top view of a stretchable panel according to another embodiment of the present disclosure. First sub-electrodes 20 on each column of island-like structures 10 may be connected sequentially to form a branch, and a branch on one column of island-like structures 10 may be connected in parallel with a branch on at least one adjacent column of island-like structures 10, to form a first electrode. Similarly, second sub-electrodes 21 on each row of island-like structures 10 may be connected sequentially to form a branch, and a branch on one row of island-like structures 10 may be connected in parallel with a branch on at least one adjacent row of island-like structures 10, to form a second electrode.

It is to be noted that, FIG. 5 only illustrates an example in which the first sub-electrodes 20 on two columns of island-like structures 10 are electrically connected sequentially to form a first electrode, and the second sub-electrodes 21 on two rows of the island-like structures 10 are electrically connected sequentially to form a second electrode, and the present disclosure is not limited thereto. In other embodiments, the first sub-electrodes 20 on more than two columns of island-like structures 10 may be electrically connected sequentially to form a first electrode, and the second sub-electrodes 21 on more than two rows of island-like structures 10 may be electrically connected sequentially to form a second electrode.

In the present disclosure, the stretchable panel includes a control device. The control device is electrically connected to the first electrode and the second electrode. The control device is configured to determine a touch position and/or a stretched state of the stretchable panel based on a change in capacitance between the first electrode and the second electrode.

It is to be noted that, regardless of the number of columns of island-like structures 10 on which the first sub-electrodes 20 are connected to form a first electrode, and the number of columns of island-like structures 10 on which the second sub-electrodes 21 are connected to form a second electrode, all the first electrodes and the second electrodes are electrically connected to the control device. Moreover, sub-electrodes on multiple paralleled columns or sub-electrodes on multiple paralleled rows may be connected with each other via auxiliary connection lines, or pins of the control device.

In a case where sub-electrodes on multiple paralleled columns or sub-electrodes on multiple paralleled rows are connected with each other via pins of the control device, each of the first electrodes is connected to a pin of the control device via a wire, each of the second electrodes is connected to a pin of the control device via a wire, and the first and second electrodes are respectively connected to different pins.

As shown in FIG. 5, sub-electrodes on multiple paralleled columns or sub-electrodes on multiple paralleled rows may be connected with each other via auxiliary connection lines. The auxiliary connection lines include first auxiliary connection lines 202 and second auxiliary connection lines 211. The first auxiliary connection lines 202 are used for connecting first sub-electrodes 20 on two paralleled columns, and the second auxiliary connection lines 211 are used for connecting second sub-electrodes 21 on two paralleled rows. The first auxiliary connection line 202 is located on the second bridge 11b, the second auxiliary connection line 211 is located on the first bridge 11a.

In the present disclosure, the control device may determine the touch position based on the change in mutual capacitance between the first electrode and the second electrode. The control device may determine a first coordinate based on the change in mutual capacitance between the first electrode and the first electrode, determine a second coordinate based on the change in mutual capacitance between the second electrode and the second electrode, and determine a stretched position based on the first coordinate and the second coordinate. In one embodiment, the control device may determine a stretched degree based on the magnitude of a sensing signal caused by the change in mutual capacitance or based on the first coordinate and the second coordinate.

In one embodiment, the detection period of the stretchable panel includes a touch detection period and/or a stretch detection period. The stretch detection period includes a first scan period and a second scan period.

In the touch detection period, the control device inputs a touch scan signal to the first electrode, detects a touch sensing signal outputted by the second electrode, and determines a touch position in response to the touch sensing signal.

In the first scan period, the control device inputs a stretch detection signal to the first electrode in an odd-numbered column, detects a first stretch sensing signal of the first electrode in an even-numbered column, and determines a first coordinate in response to the first stretch sensing signal. In the second scan period, the control device inputs a stretch detection signal to the second electrode in an odd-numbered row, detects a second stretch sensing signal of the second electrode in an even-numbered row, determines a second coordinate in response to the second stretch sensing signal, and determines the stretched position based on the first coordinate and the second coordinate, and/or determines the stretched degree based on the magnitude of the first stretch sensing signal and the magnitude of the second stretch sensing signal.

It is to be noted that in a case where the stretchable panel is stretched, the bridge 11 between the island-like structures 10 is deformed, so that the distance between the island-like structures 10 is changed, leading to a change in mutual capacitance between sub-electrodes on two adjacent island-like structures 10 at the position where the deformation occurs. The control device may obtain the first coordinate and the second coordinate by inputting the stretch detection signal and detecting the stretch sensing signal, to determine that deformation occurs at which row and which column of island structures 10. That is, the stretched position is determined. Hence, the pixel display on the island-like structure 10 at the stretched position may be controlled.

In addition, in the embodiment of the present disclosure, the stretched degree may indicates a degree to which the bridge 11 is deformed, or may indicates a distance between adjacent island-like structures 10. After determining the stretched degree, the control device may match the stretched degree with a preset range of the stretched degree. If the stretched degree is out of the preset range, an alarm may be issued to prevent components on the island-like structure 10 and the bridge 11 from being damaged due to excessive stretch.

According to the embodiment of the present disclosure, not only the touch function of the stretchable flexible display panel is realized, but also the function of detecting the stretched state is realized, so that the display state may be controlled based on the stretched state of the stretchable panel, thereby expanding the application of the stretchable panel and the flexible display device.

In one embodiment of the present disclosure, as shown in FIG. 4, an island-like structure 10 may be arranged with both the first sub-electrode 20 and the second sub-electrode 21, so that the distance between the first sub-electrode 20 and the second sub-electrode 21 may be small, resulting in a great change in mutual capacitance between the first sub-electrode 20 and the second sub-electrode 21 in a case where there is a touch on the stretchable panel, thus improving sensitivity of the touch detection. In addition, in a case where an island-like structure 10 is arranged with both the first sub-electrode 20 and the second sub-electrode 21, an area of each of the first sub-electrode 20 and the second sub-electrode 21 is small, leading to a change in mutual capacitance or a change in the sensing signal even in a case of a slight touch. That is, each island-like structure 10 serves as a minimum device capable of detecting a touch, thereby improving the accuracy of touch detection. In addition, since the area of each of the first sub-electrode 20 and the second sub-electrode 21 is small, even a corner of the island-like structure may be used for accommodating a sub-electrode, leading to uniform distribution of the first sub-electrodes 20 and the second sub-electrodes 21, thus improving the uniformity of the distribution of the sub-electrodes on the stretchable panel.

Further, in order to improve the sensitivity of detection on the stretched state, in a case where the island-like structure 10 is arranged with both the first sub-electrode 20 and the second sub-electrode 21, sub-electrodes of a same type respectively located on two adjacent island-like structures 10 are arranged adjacent to each other. That is, the first sub-electrodes 20 located on two adjacent island-like structures 10 are arranged adjacent to each other, and the second sub-electrodes 21 located on two adjacent island-like structures 10 are arranged adjacent to each other. In this way, the distance between sub-electrodes of the same type on two adjacent island-like structures 10 is reduced, such that the change in mutual capacitance between sub-electrodes of the same type is increased in a case where the stretchable panel is stretched, thereby improving the sensitivity of the stretch detection.

Similarly, in a case where in a case where the island-like structure 10 is arranged with both the first sub-electrode 20 and the second sub-electrode 21, the area of each of the first sub-electrode 20 and the second sub-electrode 21 is small, so that a change in mutual capacitance or a change in the sensing signal between the first sub-electrode 20 and the second sub-electrode 21 may be generated even in a case of a slight touch. That is, each island-like structure 10 serves as the minimum device capable of detecting a stretched state, thereby improving the accuracy of stretch detection. In addition, since the area of each of the first sub-electrode 20 and the second sub-electrode 21 is small, even a corner of the island-like device may be used for accommodating a sub-electrode, thereby leading to uniform distribution of the first sub-electrodes 20 and the second sub-electrodes 21, thus improving the uniformity of the distribution of the sub-electrodes on the stretchable panel.

As shown in FIG. 4 to FIG. 5, the first sub-electrodes 20 on two island-like structures 10 adjacent to each other at least in the row direction X are arranged adjacent to each other, and the second sub-electrodes 21 on two island-like structures 10 adjacent to each other at least in the column direction Y are arranged adjacent to each other.

In an embodiment of the present disclosure, as shown in FIG. 4 to FIG. 5, one island-like structure 10 is arranged with multiple first sub-electrodes 20 and multiple second sub-electrodes 21, and the first sub-electrodes 20 and the second sub-electrodes 21 are alternately arranged on the island-like structure 10, such that sub-electrodes of the same type located on two adjacent island-like structures 10 are arranged adjacent to each other. In this way, the sensitivity, accuracy and uniformity of the touch detection may be improved, and the sensitivity, accuracy and uniformity of detection on the stretched state may be improved.

Since the multiple first sub-electrodes 20 and the multiple second sub-electrodes 21 are alternately arranged on the island-like structure 10, one surface of the island-like structure 10 is arranged with at least one first sub-electrode 20a and at least one second sub-electrode 21a. Therefore, for the two adjacent island-like structures 10, it is ensured that the first sub-electrode 20a and the first sub-electrode 20b are arranged adjacent to each other, and the second sub-electrode 21a and the second sub-electrode 21b are arranged adjacent to each other, thereby ensuring the sensitivity of touch detection and the sensitivity of detection on the stretched state. Moreover, even if the touch position is located at a gap between the two adjacent island-like structures 10, since there are both the first sub-electrode 20 and the second sub-electrode 21 at a side of the gap, the detection of the touch position may be realized even if the finger touches a position between the two island-like structures 10. In addition, in a case where the stretch occurs at a position between the two adjacent island-like structures 10, the detection on the stretched state may be realized by the first sub-electrode 20a and the first sub-electrode 20b as well as the second sub-electrode 21a and the second sub-electrode 21b located at two sides of the gap, thereby achieving both high-accuracy touch detection and high-accuracy stretch detection. In addition, since the first sub-electrodes 20 and the second sub-electrodes 21 are alternately arranged, the first sub-electrodes 20 and the second sub-electrodes 21 may be uniformly distributed, so that the sub-electrodes are distributed uniformly, thereby improving the uniformity of the distribution of the sub-electrodes on the stretchable panel.

In another embodiment of the present disclosure, as shown in FIG. 4, the island-like structure 10 has a rectangular shape or an approximately rectangular shape. The island-like structure 10 is arranged with two first sub-electrodes 20 and two second sub-electrodes 21, and each of the first sub-electrode 20 and the second sub-electrode 21 has a rectangular shape or an approximately rectangular shape. Moreover, the island-like structure 10 is divided into four rectangular regions c1 to c4 along its two symmetry axes (thin dotted lines shown in FIG. 4), and the sub-electrodes are arranged in one-to-one correspondence with the rectangular regions. Sub-electrodes of the same type are respectively arranged in rectangular regions sharing no edge.

That is, as shown in FIG. 4, the first first sub-electrode 20 is arranged in the rectangular region c1, the second first sub-electrode 20 is arranged in the rectangular region c3, and the rectangular regions c1 and c3 share no edge, that is, the rectangular regions c1 and c3 are arranged diagonally. The first second sub-electrode 21 is arranged in the rectangular area c2, the second second sub-electrode 21 is arranged in the rectangular area c4, and the rectangular areas c2 and c4 share no edge, that is, the rectangular areas c2 and c4 are arranged diagonally.

In the above embodiment, since each of the sub-electrodes has a rectangular shape or an approximately rectangular shape, which is similar to that of the island-like structure 10, the shape formed by the arrangement of the sub-electrodes in an array (i.e., an overall shape of the sub-electrode array) complies with that of the island-like structure. Therefore, the sub-electrodes are arranged on the island structure 10 densely, and even the sides or corners of the island-like structure may be arranged with electrodes, so that the accuracy of the touch detection and detection on the stretched state is improved.

Figure 6:
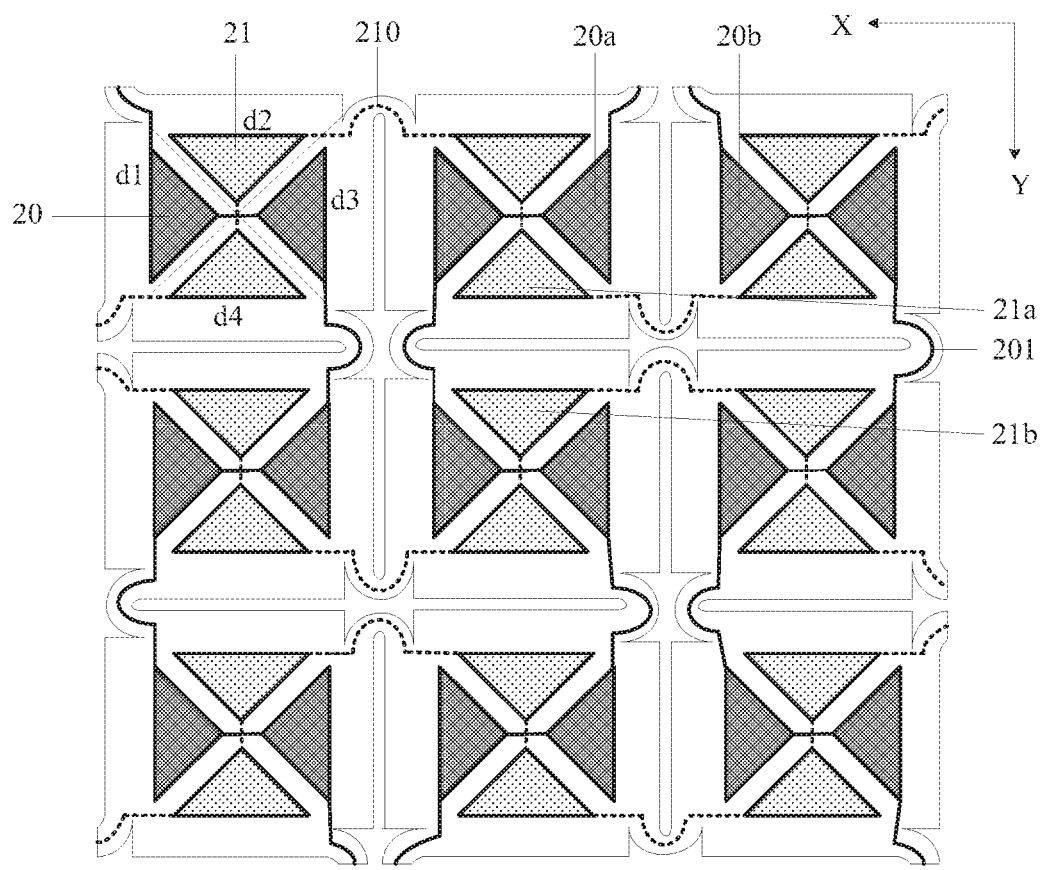
FIG. 6 is a schematic top view of a structure of a stretchable panel according to another embodiment of the present disclosure.

In another embodiment of the present disclosure, as shown in FIG. 6, FIG. 6 is a schematic top view of a structure of a stretchable panel according to another embodiment of the present disclosure. The island-like structure 10 has a rectangular shape or an approximately rectangular shape. The island-like structure 10 is arranged with two first sub-electrodes 20 and two second sub-electrodes 21, and each of the first sub-electrode 20 and the second sub-electrode 21 has a triangular shape or an approximately triangular shape. Moreover, the island-like structure 10 is divided into four triangular regions along its two diagonal lines (thin dotted lines shown in FIG. 6), and the sub-electrodes are arranged in one-to-one correspondence with the triangular regions. Two sub-electrodes of the same type are arranged in two triangular regions sharing no edge, and apex angles of the two sub-electrodes are arranged opposite to each other.

That is, as shown in FIG. 6, the first first sub-electrode 20 is arranged in the triangular region d1, the second first sub-electrode 20 is arranged in the triangular region d3, and the triangular regions d1 and d3 share no edge, that is, the triangular regions d1 and d3 are arranged diagonally. The first second sub-electrode 21 is arranged in the triangular region d2, the second second sub-electrode 21 is arranged in the triangular region d4, and the triangular regions d2 and d4 share no edge, that is, the triangular regions d2 and d4 are arranged diagonally.

In the above embodiment, although each sub-electrode has a triangular shape, an arrangement formed by combining all the sub-electrodes on the island-like structure 10 also has a rectangular shape or an approximately rectangular shape, which is similar to that of the island-like structure 10, thereby providing a sub-electrode arranging manner while ensuring the accuracy of touch detection and detection on the stretched state.

It is to be noted that, in the structure shown in FIG. 6, a surface of the island-like structure 10 is only arranged with one first sub-electrode 20a or one second sub-electrode 21a. For two adjacent island-like structures 10, it may be only ensured that the first sub-electrode 20a is arranged adjacent to the first sub-electrode 20b, or that the second sub-electrode 21a is arranged adjacent to the second sub-electrode 21b. However, since an adjacent portion between the first sub-electrode 20a and the first sub-electrode 20b arranged adjacent to each other is long (i.e., the capacitance between the first sub-electrode 20a and the first sub-electrode 20b is large), and an adjacent portion between the second sub-electrode 21a and the second sub-electrode 21b arranged adjacent to each other is long, in a case where the stretchable substrate is stretched, the change in mutual capacitance between the first sub-electrode 20a and the first sub-electrode 20b is large, and the change in mutual capacitance between the second sub-electrode 21a and the second sub-electrode 21b is large, which is more favorable for ensuring the sensitivity of detection on the stretched state.

Moreover, even if the touch position is located at a gap between the two adjacent island-like structures 10, since a side of the gap is arranged with both the first sub-electrode 20 and the second sub-electrode 21, the detection on the touch position may be realized. In addition, in a case where the stretching occurs at a position between the adjacent two island-like structures 10, the detection on the stretched state may be realized by the first sub-electrode 20a and the first sub-electrode 20b as well as the second sub-electrode 21a and the second sub-port located on two sides of the gap, thereby achieving both high-accuracy touch detection and high-accuracy stretch detection. In addition, since the first sub-electrodes 20 and the second sub-electrodes 21 are alternately arranged, such that first sub-electrodes 20 and the second sub-electrodes 21 may be distributed uniformly, thereby realizing uniform distribution of the sub-electrodes, thus improving the uniformity of the distribution of sub-electrodes on the stretchable panel.

It is to be noted that, in the structure shown in FIG. 4 to FIG. 6, the island-like structure 10 is arranged with multiple first sub-electrodes 20 and multiple second sub-electrodes 21. However, the present disclosure is not limited thereto. In another embodiment of the disclosure, the island-like structure 10 may be arranged with only one first sub-electrode 20 and one second sub-electrode 21.

Figure 7:
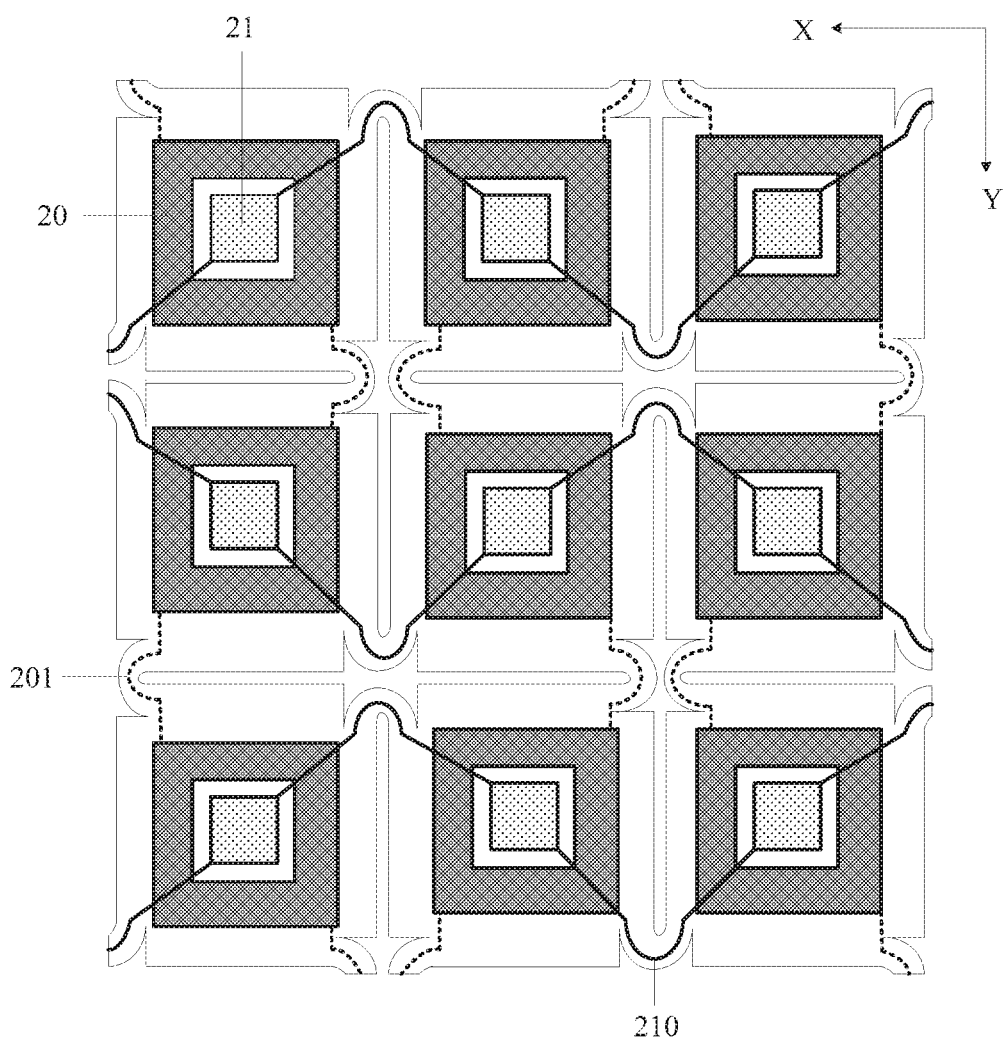
FIG. 7 is a schematic top view of a structure of a stretchable panel according to another embodiment of the present disclosure.

As shown in FIG. 7, FIG. 7 is a schematic top view of a structure of a stretchable panel according to another embodiment of the present disclosure. On one island-like structure 10, the first sub-electrode 20 has a hollow region 20a, and a projection of the second sub-electrode 21 on the stretchable substrate 1 is located in the hollow region 20a of the first sub-electrode 20. The first sub-electrode 20, the hollow region 20a and the second sub-electrode 21 have the same shape as the island-like structure 10.

In one embodiment, in a case where the island-like structure 10 has a rectangular shape or an approximately rectangular shape, each of the first sub-electrode 20, the hollow region 20a and the second sub-electrode 21 has a rectangular shape or an approximately rectangular shape to fully utilize the space on the island-like structure 10. In this way, area of each of the first sub-electrode 20 and the second sub-electrode 21 is as large as possible, such that the change in mutual capacitance between the first sub-electrode 20 and the second sub-electrode 21, the change in mutual capacitance between the first sub-electrode 20 and the first sub-electrode 20 and the change in mutual capacitance between the second sub-electrode 21 and the second sub-electrode 21 are as large as possible, thereby improving the sensitivity of the touch detection and the sensitivity of detection on the stretched state for the stretchable panel.

In the above embodiment, since the first sub-electrode 20 surrounds the second sub-electrode 21, electric field lines of the second sub-electrode 21 are shielded by electric field lines of the first sub-electrode 20. Therefore, even in a case where a distance between the first sub-electrode 20 on one island-like structure 10 and the second sub-electrode 21 on another island-like structure 10 is small due to the stretch, no mutual capacitance is generated between the first sub-electrode 20 and the second sub-electrode 21. That is, the first sub-electrode 20 is arranged surrounding the second sub-electrode 21, such that the mutual capacitance between the first sub-electrode 20 and the second sub-electrode 21 on one island-like structure 10 is not affected by the stretch, thereby ensuring the accuracy and sensitivity of the touch detection of the stretchable panel. Moreover, since the first sub-electrodes 20 and the second sub-electrodes 21 are arranged center-symmetrically, the mutual capacitance between the first sub-electrode 20 and the second sub-electrode 21 is not affected regardless the stretching direction, that is, the touch detection of the stretchable panel is not affected. Moreover, since the first sub-electrode 20 surrounds the second sub-electrode 21, the adjacent portion between the first sub-electrode 20 and the second sub-electrode 21 is longer, so that the change in mutual capacitance between the first electrode and the second electrode is large in a case of a touch, thereby further improving the sensitivity of touch detection.

Figure 8:
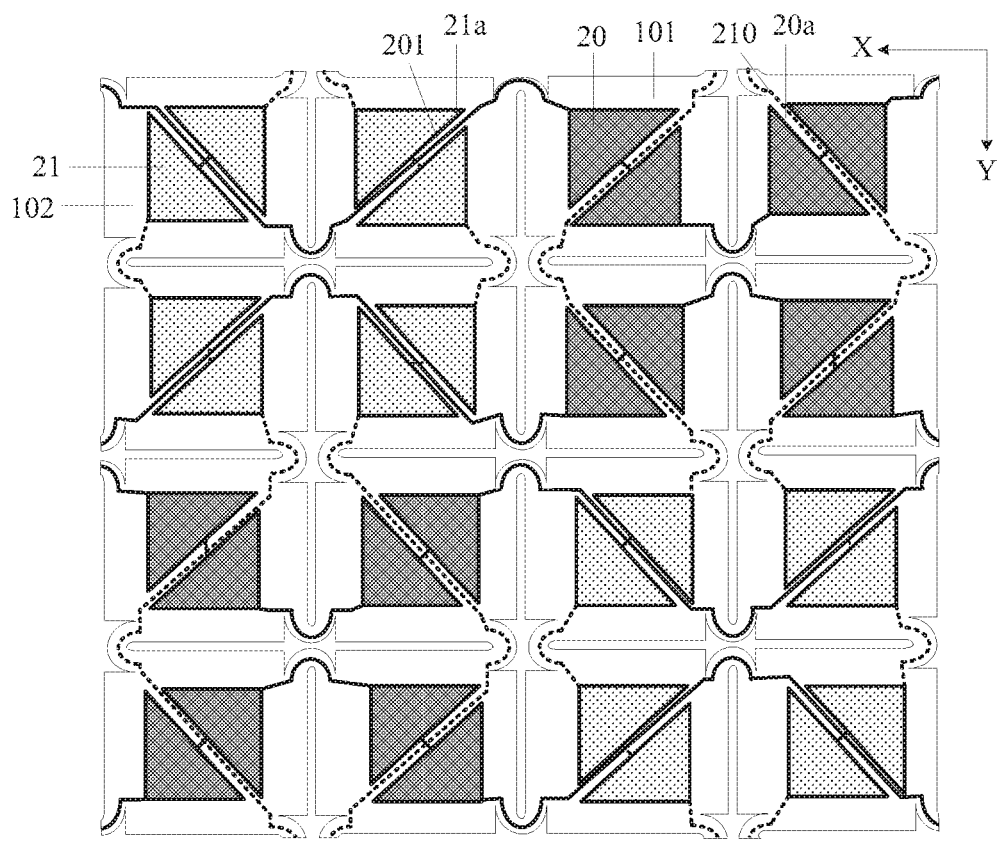
FIG. 8 is a schematic top view of a structure of a stretchable panel according to another embodiment of the present disclosure.

Further, in another embodiment of the present disclosure, the island-like structure 10 may be arranged with only the first sub-electrode 20 or the second sub-electrode 21. As shown in FIG. 8, FIG. 8 is a schematic top view of a structure of a stretchable panel according to another embodiment of the present disclosure. The island-like structure 10 is arranged with either the first sub-electrode 20 or the second sub-electrode 21.

It is to be noted that the island-like structure 10 being arranged with only the first sub-electrode 20 means that the island-like structure 10 is arranged with one or more sub-electrodes, and all the sub-electrodes are the first sub-electrodes 20. Similarly, the island-like structure 10 being arranged with only the second sub-electrode 21 means that the island-like structure 10 is arranged with one or more sub-electrodes, and all of the sub-electrodes are the second sub-electrodes 21.

As shown in FIG. 8, the island-like structure 10 includes a first island-like structure 101 and a second island-like structure 102. The first island-like structure 101 is arranged with the first sub-electrode 20, and the second island-like structure 102 is arranged with the second sub-electrode 21. Moreover, in any column of island-like structures 10 and any row of island-like structures 10, at least one first island-like structure 101 and at least one second island-like structure 102 are alternately arranged. As shown in FIG. 8, two first island-like structures 101 and two second island-like structures 102 are alternately arranged.

In the above embodiment, at least one first island structure 101 and at least one second island structure 102 are alternately arranged, so that a sub-electrode arranging manner is provided while determining a touch position based on the change in mutual capacitance between the first electrode and the second electrode.

It is to be noted that, in the structures shown in FIG. 6 to FIG. 8, the first sub-electrodes 20 on at least one column of island-like structures 10 are electrically connected sequentially to form a first electrode, and the second sub-electrodes 21 on at least one row of island-like structure 10 are electrically connected sequentially to form a second electrode, thereby determining the touch position and/or the stretched state of the stretchable panel based on the change in capacitance between the first electrode and the second electrode.

In addition, in the present disclosure, two adjacent first sub-electrodes 20 are connected with each other via a first connection line 201, and two adjacent second sub-electrodes 21 are connected with each other via a second connection line 210. The first connection line 201 is insulated from the second connection line 210.

As shown in FIG. 4 to FIG. 7, the first connection line 201 is partially located on a first bridge 11a to connect the first sub-electrodes 20 on two adjacent island-like structures 10. The second connection line 210 is partially located on a second bridge 11b, to connect the second sub-electrodes 21 on two adjacent island-like structures 10.

In addition, the first connection line 201 is partially located on the island-like structure 10 and extends in a diagonal direction of the first pair of angles facing to each other, such as a direction from the first angle b1 to the second angle b2. The second connection line 210 is partially located on the island-like structure 10 and extends in a diagonal direction of the second pair of angles facing to each other, such as a direction from the third angle b3 to the fourth angle b4. As shown in FIG. 8, the first sub-electrode 20 includes a first slit 20a, and the first slit 20a is overlapped with the second connection line 210. The second sub-electrode 21 includes a second slit 21a, and the second slit 21a is overlapped with the first connection line 201.

In one embodiment, the first sub-electrode 20 is divided into two triangular sub-electrodes by the first slit 20a, and the second sub-electrode 21 is divided into two triangular sub-electrodes by the second slit 21a. In other words, the island-like structure 10 has a rectangular shape or an approximately rectangular shape, and each of the first sub-electrode 20 and the second sub-electrode 21 has the same shape as the island-like structure 10, thereby improving the accuracy of touch on the stretchable panel. In addition, the first sub-electrode 20 having a rectangular shape or an approximately rectangular shape is divided into two triangular parts by a first slit 20a extending in its diagonal line, and a second sub-electrode 21 having a rectangular shape or an approximately rectangular shape is divided into two triangular parts by a second slit 21a extending in its diagonal line. According to the wiring manner in this embodiment, the two triangular parts of the first sub-electrode 20 are connected to each other via a conductive portion (for example, a wire, a bridge), and the two triangular parts of the second sub-electrode 21 are connected to each other by a conductive portion (for example, a wire, a bridge). The two triangular parts of the first sub-electrode 20 are respectively connected to first sub-electrodes 20 on adjacent island-like structures 10, and the two triangular parts of the first sub-electrode 21 are respectively connected to first sub-electrodes 21 on adjacent island-like structures 10.

In the above embodiment, each of the first sub-electrode 20 and the second sub-electrode 21 has the same shape as the island-like structure 10, thereby improving the accuracy of touch on the stretchable panel. The first sub-electrode 20 having a rectangular shape or an approximately rectangular shape is divided into two triangular parts by a first slit 20a extending in its diagonal line, and a second sub-electrode 21 having a rectangular shape or an approximately rectangular shape is divided into two triangular parts by a second slit 21a extending in its diagonal line, which provides a sub-electrode arranging manner and a wiring manner.

In addition, according to the present disclosure, the stretchable panel further includes a pixel structure layer 3. The pixel structure layer 3 includes multiple pixels, which are located on the island-like structures 10. In a direction perpendicular to the stretchable substrate, the electrode layer 2 is located on a side of the pixel structure layer 3 facing away from the island-like structure 10.

Figure 9:
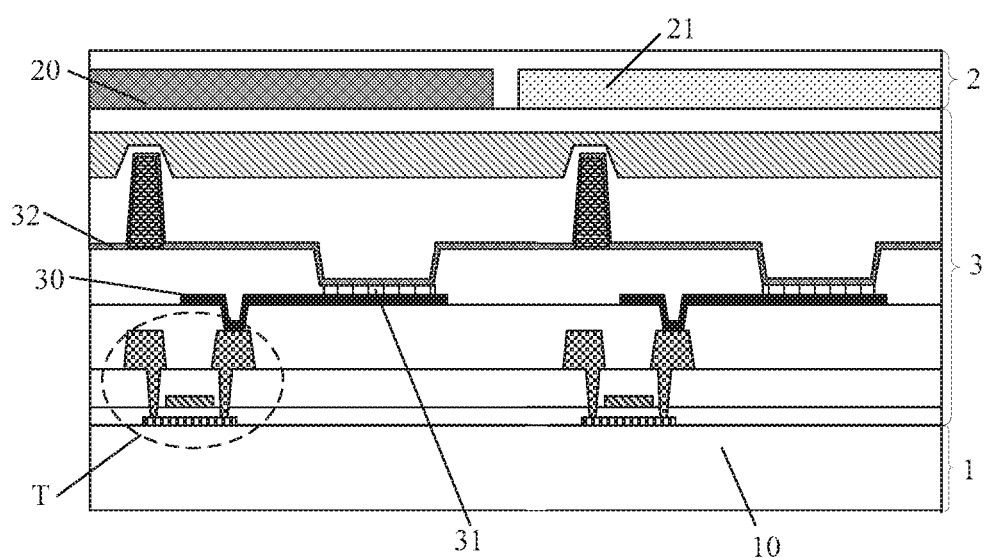
FIG. 9 is a schematic sectional view of the structure of the stretchable panel shown in FIG. 4 taken along a cutting line AA.

In one embodiment, as shown in FIG. 9, FIG. 9 is a schematic sectional view of the structure of the stretchable panel according to an embodiment of the present disclosure. The pixel structure layer 3 includes multiple gate lines, multiple data lines, a driving circuit and pixels. The driving circuit includes a thin film transistor T located on the island-like structure 10. A drain of the thin film transistor T is connected to the pixel electrode 30. The pixel electrode 30 is electrically connected to one end of an organic light emitting element 31, and the other end of the organic light emitting element 31 is electrically connected to a common electrode 32. After the gate line transmits a scan signal to the driving circuit and the data line transmits a data signal to the driving circuit, the driving circuit supplies current to the organic light emitting element 31 through the turned-on thin film transistor T and the pixel electrode 30, so that the organic light emitting element 31 emits light and displays a screen.

In one embodiment, the stretchable substrate 1 shares an encapsulation layer or another layer in the pixel structure layer 3, such that the electrode layer 2 located on the pixel structure layer 3 is located on the stretchable substrate 1.

Figure 10:
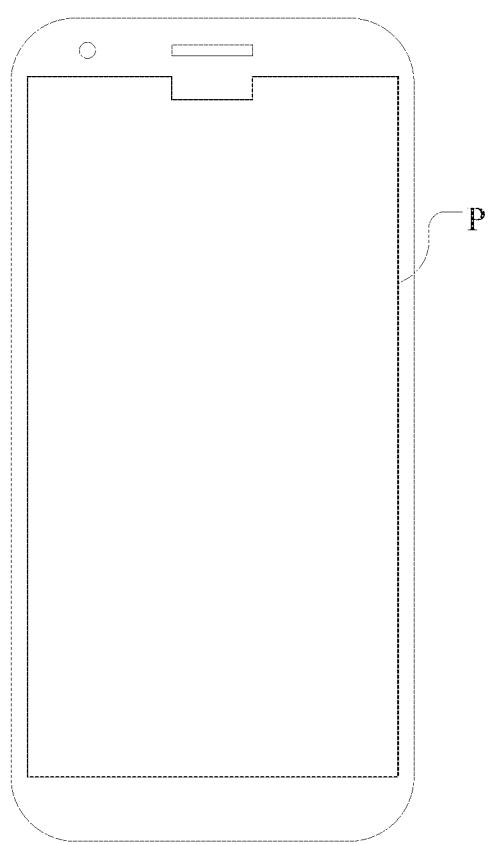
FIG. 10 is a schematic diagram of a structure of a flexible display device according to an embodiment of the present disclosure.

A flexible display device is further provided according to an embodiment of the present disclosure. As shown in FIG. 10, FIG. 10 is a schematic diagram of a structure of a flexible display device according to an embodiment of the present disclosure. The flexible display device P includes the stretchable panel according to any of the above embodiments. The flexible display device includes, but is not limited to, a mobile phone, a tablet computer, a digital camera, and the like.

The embodiments in the specification are described in a progressive way, and each embodiment lays emphasis on differences from other embodiments. For the same or similar parts between various embodiments, one may refer to the description of other embodiments. For the device disclosed in an embodiment, since it corresponds to the method disclosed in an embodiment, the description is relatively simple, and the relevant part may refer to the description in the method part.

The invention claimed is:

1. A stretchable panel comprising:
a stretchable substrate, wherein the stretchable substrate comprises a plurality of island-like structures arranged in an array in a row direction and a column direction, and any two adjacent island-like structures are separated from each other and are connected with each other via a bridge;
an electrode layer, wherein the electrode layer comprises one or more first sub-electrodes and one or more second sub-electrodes, the first sub-electrode is insulated from the second sub-electrode, and the first sub-electrodes and the second sub-electrodes are all located on the plurality of island-like structures; and first sub-electrodes located on at least one column of island-like structures are electrically connected sequentially to form a first electrode, and second sub-electrodes located on at least one row of island-like structures are electrically connected sequentially to form a second electrode; and
a control device, wherein
the control device is electrically connected to the first electrode and the second electrode, and
the control device is configured to determine a stretched state of the stretchable panel and/or a touch position based on a change in capacitance between the first electrode and the second electrode,
wherein a detection period of the stretchable panel comprises at least one of a touch detection period and a stretch detection period, and the stretch detection period comprises a first scan period and a second scan period, and wherein
in the touch detection period, the control device is configured to input a touch scan signal to the first electrode, detect a touch sensing signal outputted by the second electrode, and determine a touch position in response to the touch sensing signal;
in the first scan period, the control device is configured to input a stretch detection signal to the first electrode in an odd-numbered column, detect a first stretch sensing signal of the first electrode in an even-numbered column, and determine a first coordinate in response to the first stretch sensing signal; and
in the second scan period, the control device is configured to input a stretch detection signal to the second electrode in an odd-numbered row, detect a second stretch sensing signal of the second electrode in an even-numbered row, determine a second coordinate in response to the second stretch sensing signal, and determine a stretched position and/or stretched degree based on the first coordinate and the second coordinate.

2. The stretchable panel according to claim 1, wherein the island-like structure is arranged with at least one first sub-electrode and at least one second sub-electrode.

3. The stretchable panel according to claim 2, wherein sub-electrodes of a same type respectively on two adjacent island-like structures are arranged adjacent to each other.

4. The stretchable panel according to claim 3, wherein the island-like structure is arranged with a plurality of first sub-electrodes and a plurality of second sub-electrodes, and the first sub-electrodes and the second sub-electrodes on the island-like structure are arranged alternately.

5. The stretchable panel according to claim 2, wherein the island-like structure is arranged with two first sub-electrodes and two second sub-electrodes, and each of the two first sub-electrodes and the two second sub-electrodes has a triangular shape or an approximately triangular shape,
the island-like structure has a rectangular shape or an approximately rectangular shape; the island-like structure is divided into four triangular regions along two diagonal lines of the island-like structure, and the two first sub-electrodes and the two second sub-electrodes are arranged in one-to-one correspondence with the four triangular regions, and wherein
two sub-electrodes of a same type are respectively arranged on two triangular regions sharing no edge, wherein apex angles of the two sub-electrodes are located opposite to each other.

6. The stretchable panel according to claim 2, wherein the island-like structure is arranged with two first sub-electrodes and two second sub-electrodes, and each of the two first sub-electrodes and the two second sub-electrodes has a rectangular shape or an approximately rectangular shape,
the island-like structure has a rectangular shape or an approximately rectangular shape; the island-like structure is divided into four rectangular regions along two symmetry axes of the island-like structure, and the two first sub-electrodes and the two second sub-electrodes are arranged in one-to-one correspondence with the four rectangular regions, wherein
two sub-electrodes of a same type are respectively arranged on two rectangular regions sharing no edge.

7. The stretchable panel according to claim 2, wherein on one island-like structure, the first sub-electrode has a hollow region, and a projection of the second sub-electrode on the stretchable substrate is located in the hollow region of the first sub-electrode.

8. The stretchable panel according to claim 7, wherein the first sub-electrode, the hollow region and the second sub-electrode has a same shape as the island-like structure.

9. The stretchable panel according to claim 1, wherein the island-like structure is arranged with either a first sub-electrode or a second sub-electrode.

10. The stretchable panel according to claim 9, wherein the island-like structure comprises a first island-like structure and a second island-like structure, the first island-like structure is arranged with the first sub-electrode and the second island-like structure is arranged with the second sub-electrode, and
in any column of the island-like structures and in any row of the island-like structures, at least one first island-like structure and at least one second island-like structure are arranged alternately.

11. The stretchable panel according to claim 1, wherein first sub-electrodes on each column of island-like structures are electrically connected sequentially to form a branch, and a branch on one column of island-like structures is connected in parallel to a branch on at least one adjacent column of island-like structures to form the first electrode, and second sub-electrodes on each row of island-like structures are electrically connected sequentially to form a branch, and a branch on one column of island-like structures is connected in parallel to a branch on at least one adjacent row of island-like structures to form the second electrode.

12. The stretchable panel according to claim 1, wherein the island-like structure has a rectangular shape or an approximately rectangular shape; the island-like structure comprises a first pair of angles facing to each other and a second pair of angles facing to each other; the first pair of angles comprises a first angle and a second angle, and the second pair of angles comprises a third angle and a fourth angle;

the bridge comprises a first bridge and a second bridge, and wherein in the column direction, angles of a same type on two adjacent island-like structures are arranged adjacent to each other, and connected with each other via the first bridge;

in the row direction, angles of a same type on the adjacent island-like structures are arranged adjacent to each other, and connected with each other via the second bridge.

13. The stretchable panel according to claim 12, wherein two adjacent first sub-electrodes are connected with each other via a first connection line, and two adjacent second sub-electrodes are connected with each other via a second connection line, the first connection line is insulated from the second connection line, and wherein the first connection line is located on the first bridge partially, to connect first sub-electrodes on the two adjacent island-like structures;

the second connection line is located on the second bridge partially, to connect second sub-electrodes on the two adjacent island-like structures.

14. The stretchable panel according to claim 13, wherein the first connection line is located on the island-like structure partially and extends along a diagonal direction of the first pair of angles;

the second connection line is located on the island-like structure partially and extends along a diagonal direction of the second pair of angles;

the first sub-electrode comprises a first slit, and the first slit is overlapped with the second connection line; and the second sub-electrode comprises a second slit, and the second slit is overlapped with the first connection line.

15. The stretchable panel according to claim 1, further comprising:

a pixel structure layer comprising a plurality of pixels, wherein the pixels are located on the island-like structures; and in a direction perpendicular to the stretchable substrate, the electrode layer is located on a side of the pixel structure layer facing away from the island-like structure.

16. A flexible display device comprising the stretchable panel according to claim 1.

* * * * *